US009625832B2

(12) United States Patent
Donaher et al.

(10) Patent No.: US 9,625,832 B2
(45) Date of Patent: Apr. 18, 2017

(54) PLANAR MOTOR SYSTEM WITH INCREASED EFFICIENCY

(71) Applicant: Rudolph Technologies, Inc., Flanders, NJ (US)

(72) Inventors: J. Casey Donaher, Westford, MA (US); Craig Simpson, Danville, VT (US); Peter John Gerard Dufault, Pepperell, MA (US)

(73) Assignee: Rudolph Technologies, Inc., Flanders, NJ (US)

( * ) Notice: Subject to any disclaimer, the term of this patent is extended or adjusted under 35 U.S.C. 154(b) by 57 days.

(21) Appl. No.: 14/432,912

(22) PCT Filed: Sep. 27, 2013

(86) PCT No.: PCT/US2013/062099
§ 371 (c)(1),
(2) Date: Apr. 1, 2015

(87) PCT Pub. No.: WO2014/055335
PCT Pub. Date: Apr. 10, 2014

(65) Prior Publication Data
US 2015/0309425 A1 Oct. 29, 2015

Related U.S. Application Data

(60) Provisional application No. 61/710,529, filed on Oct. 5, 2012.

(51) Int. Cl.
*H02K 41/02* (2006.01)
*G03F 7/20* (2006.01)
*H02K 41/03* (2006.01)

(52) U.S. Cl.
CPC ...... *G03F 7/70716* (2013.01); *G03F 7/70758* (2013.01); *H02K 41/02* (2013.01); *H02K 41/031* (2013.01); *H02K 2201/18* (2013.01)

(58) Field of Classification Search
CPC .................................................... H02K 41/02
(Continued)

(56) References Cited

U.S. PATENT DOCUMENTS 4,560,911 A   12/1985 Chitayat
4,769,680 A    9/1988 Resor et al.
(Continued)

FOREIGN PATENT DOCUMENTS

GB        1367808 A     9/1974

OTHER PUBLICATIONS

International Search Report and Written Opinion mailed on Jan. 30, 2014, in connection with international patent application No. PCT/US13/62099, 11 pgs.

*Primary Examiner* — David S Luo
(74) *Attorney, Agent, or Firm* — Chiesa Shahinian & Giantomasi PC

(57) ABSTRACT

A planar motor system comprises a platen with a first planar motor component and a stage with a second planar motor component. The stage can move along a first cardinal axis or a second cardinal axis. The planar motor system further comprises a drive system. When the drive system is energized in a first drive configuration, it applies a first force and a second force. The first force and the second force are not parallel to any cardinal axis. A vector sum of the first force and the second force is parallel to the first cardinal axis. When the drive system is energized in a second drive configuration, it applies a third force and a fourth force. The third force and the fourth force are not parallel to any cardinal axis. A vector sum of the third force and the fourth force is parallel to the second cardinal axis.

12 Claims, 26 Drawing Sheets

(58) Field of Classification Search
USPC .................................................. 318/3, 4, 5
See application file for complete search history.

(56) References Cited

U.S. PATENT DOCUMENTS

| | | | |
|---|---|---|---|
| 4,893,071 A | 1/1990 | Miller | |
| 4,958,115 A | 9/1990 | Miller | |
| RE33,836 E | 3/1992 | Resor et al. | |
| 5,828,142 A | 10/1998 | Simpson | |
| 6,028,376 A * | 2/2000 | Osanai ................ | G03F 7/70716 310/12.13 |
| 6,389,702 B1 | 5/2002 | Dudley | |
| 7,215,095 B2 * | 5/2007 | Sekiguchi .............. | G03B 27/02 318/560 |
| 7,898,119 B2 | 3/2011 | Sato | |
| 8,140,288 B2 * | 3/2012 | Yang .................. | G03F 7/70725 318/128 |

\* cited by examiner

VIEW A

VIEW B

VIEW C

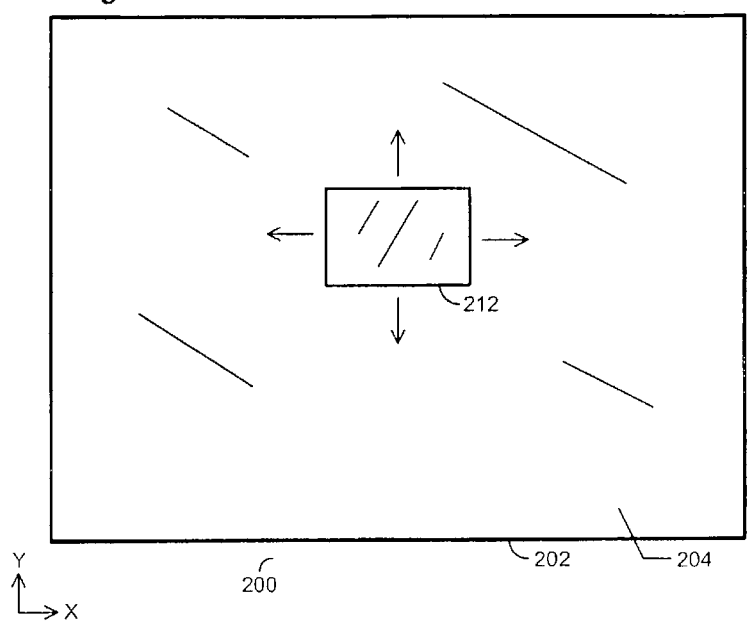
FIG. 2A   VIEW A
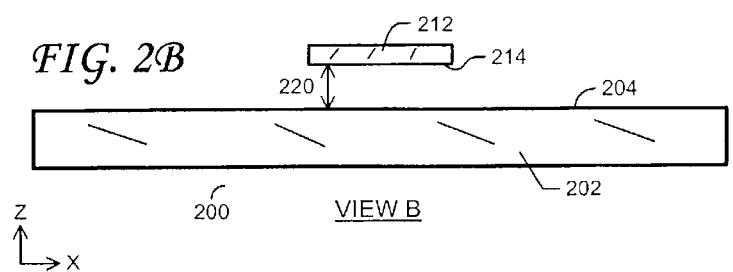
FIG. 2B   VIEW B

VIEW A

VIEW A

VIEW X-X'

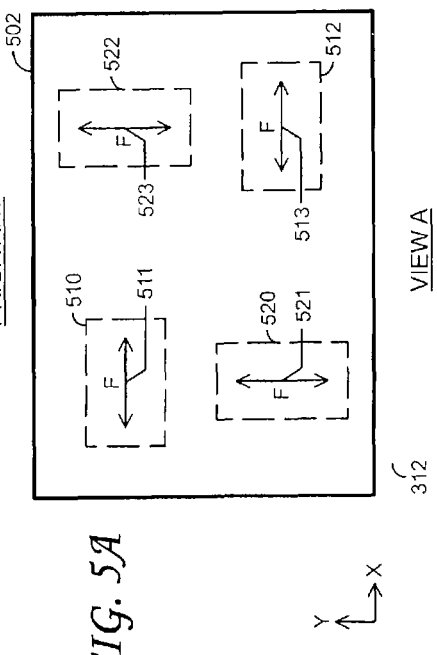
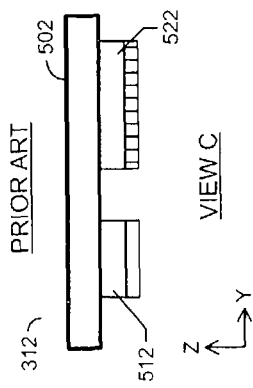
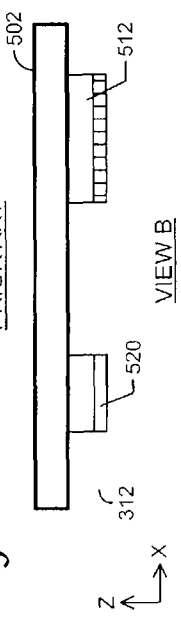
FIG. 5A PRIOR ART
FIG. 5B PRIOR ART
FIG. 5C PRIOR ART

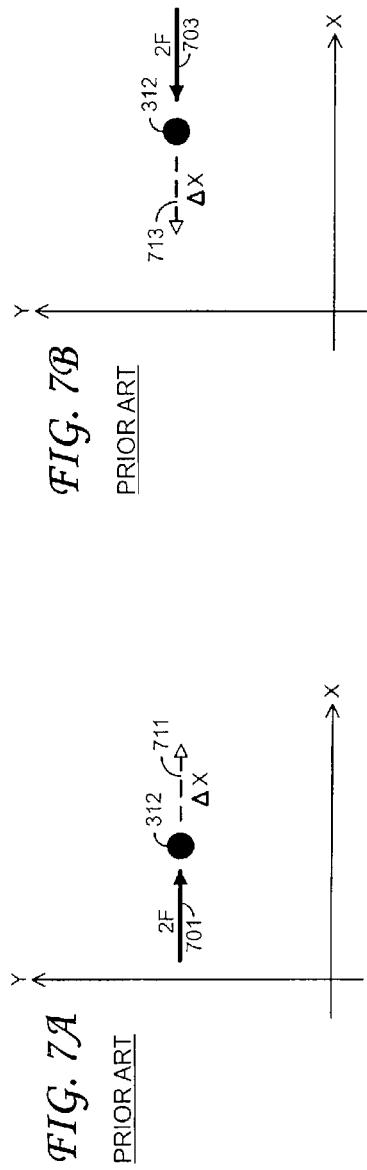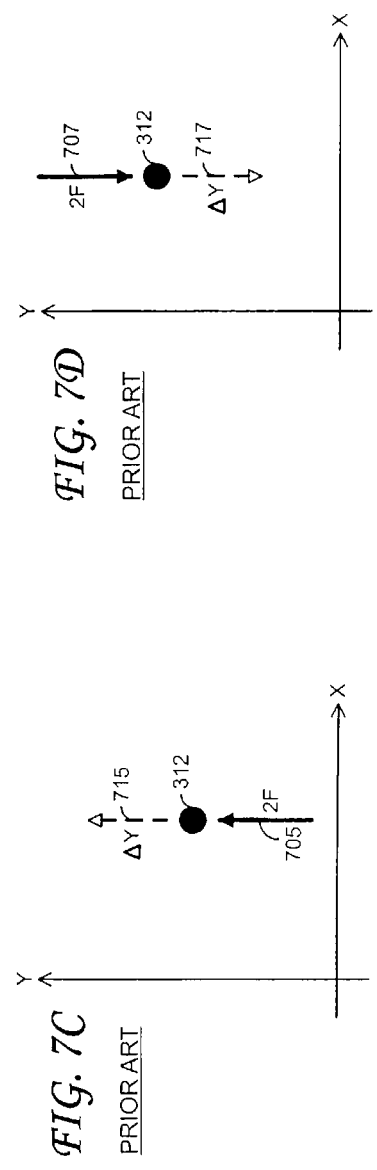
FIG. 7A PRIOR ART
FIG. 7B PRIOR ART
FIG. 7C PRIOR ART
FIG. 7D PRIOR ART

VIEW A

VIEW X1-X1'

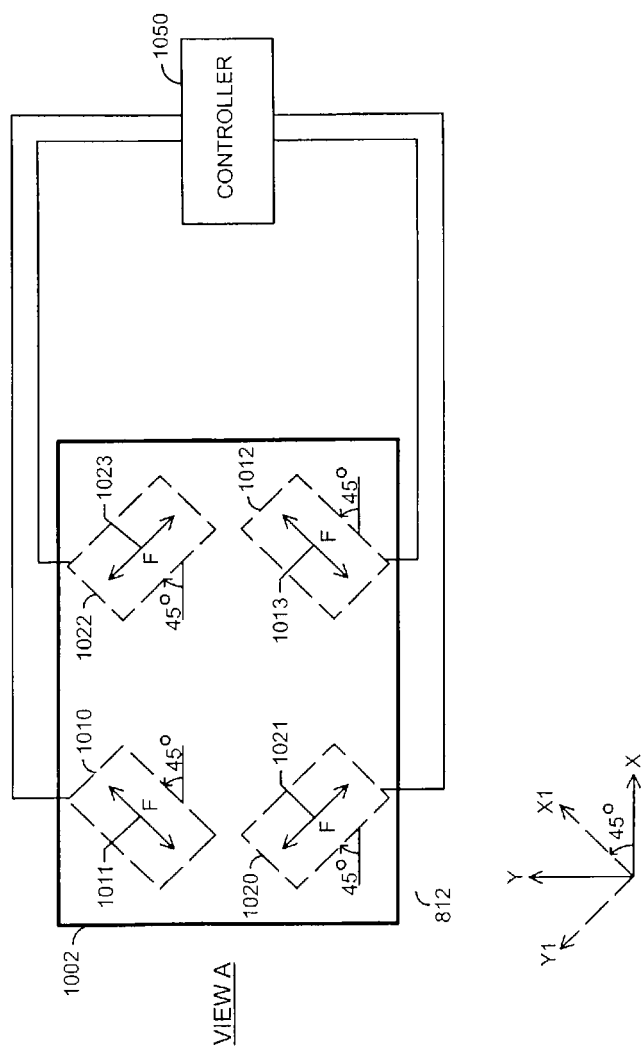

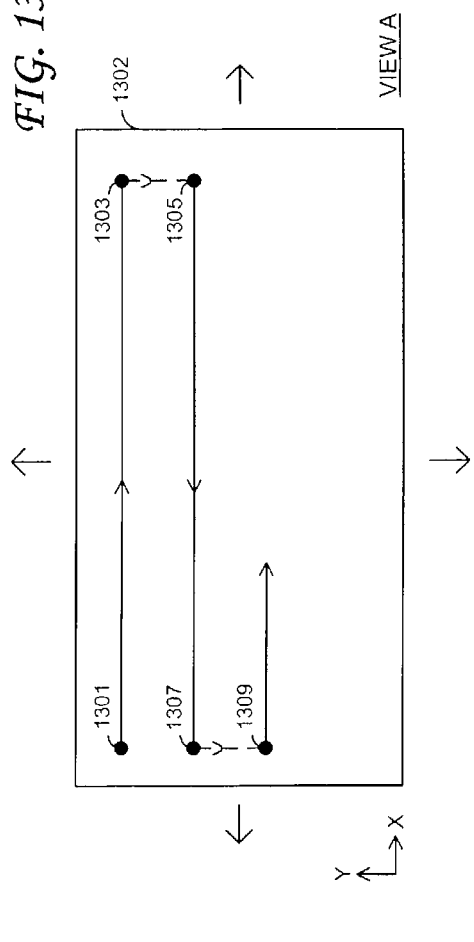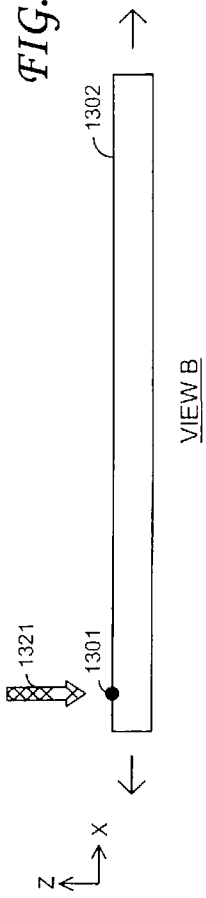

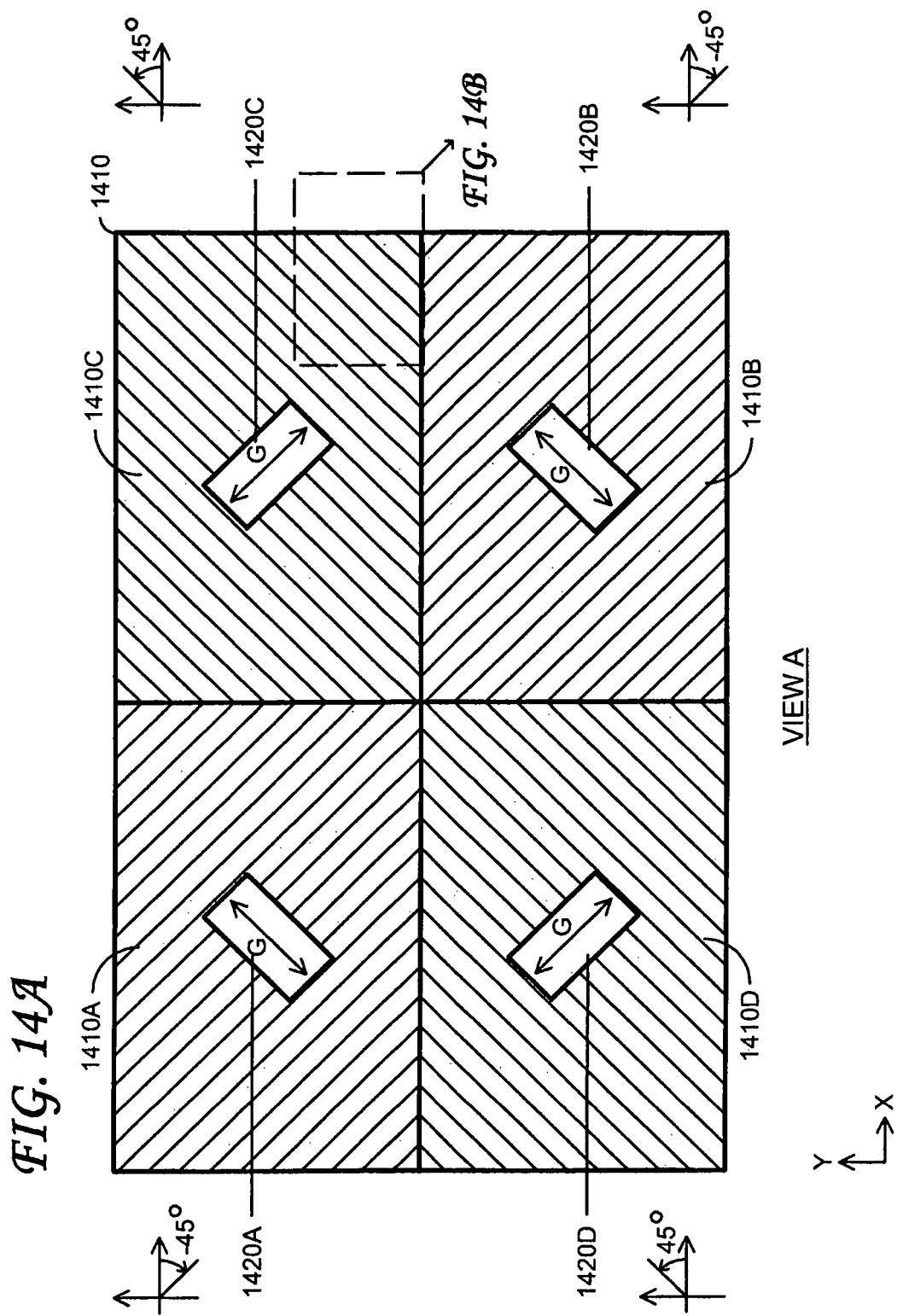

VIEW A

VIEW H-H'

VIEW A

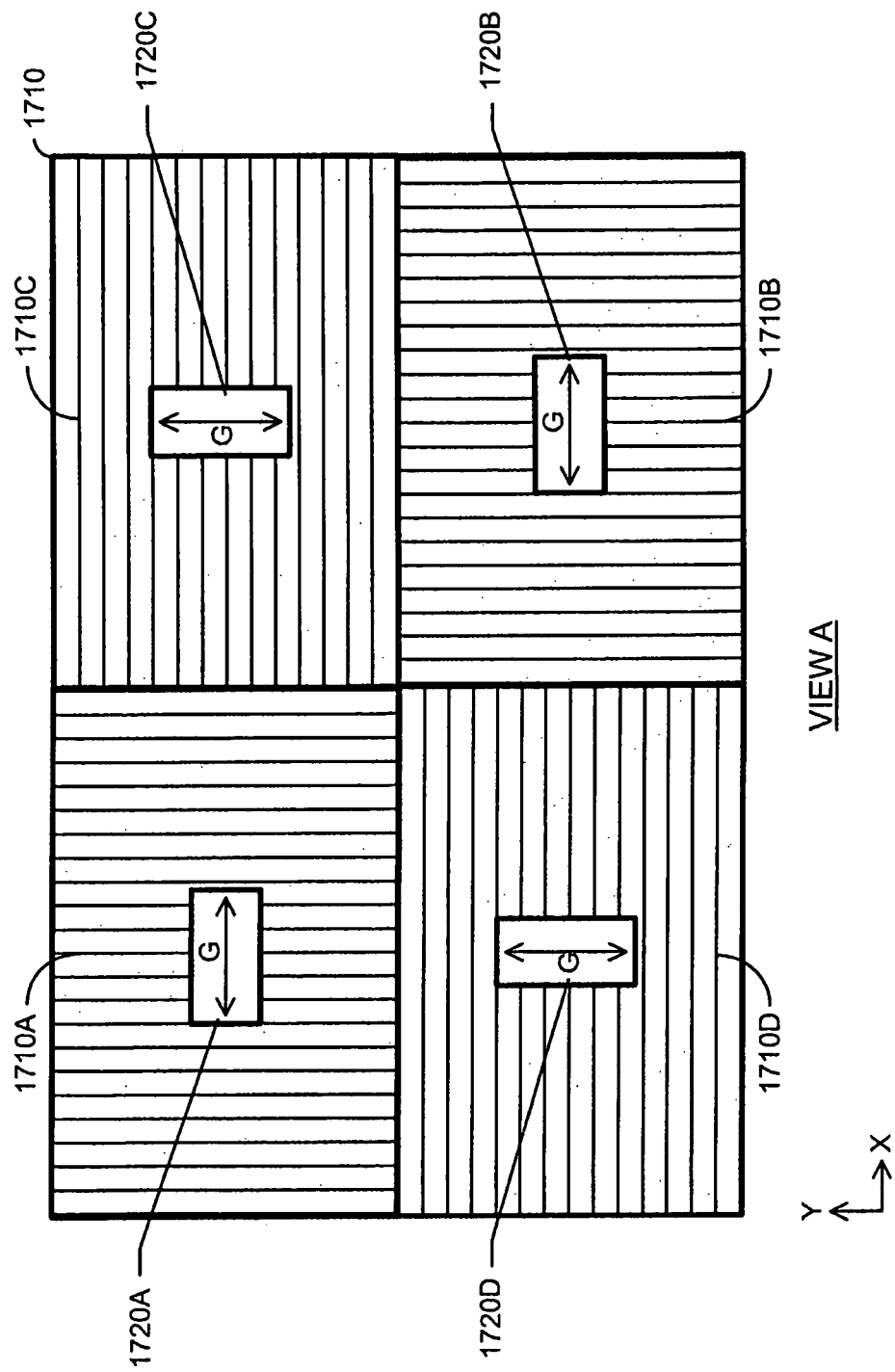

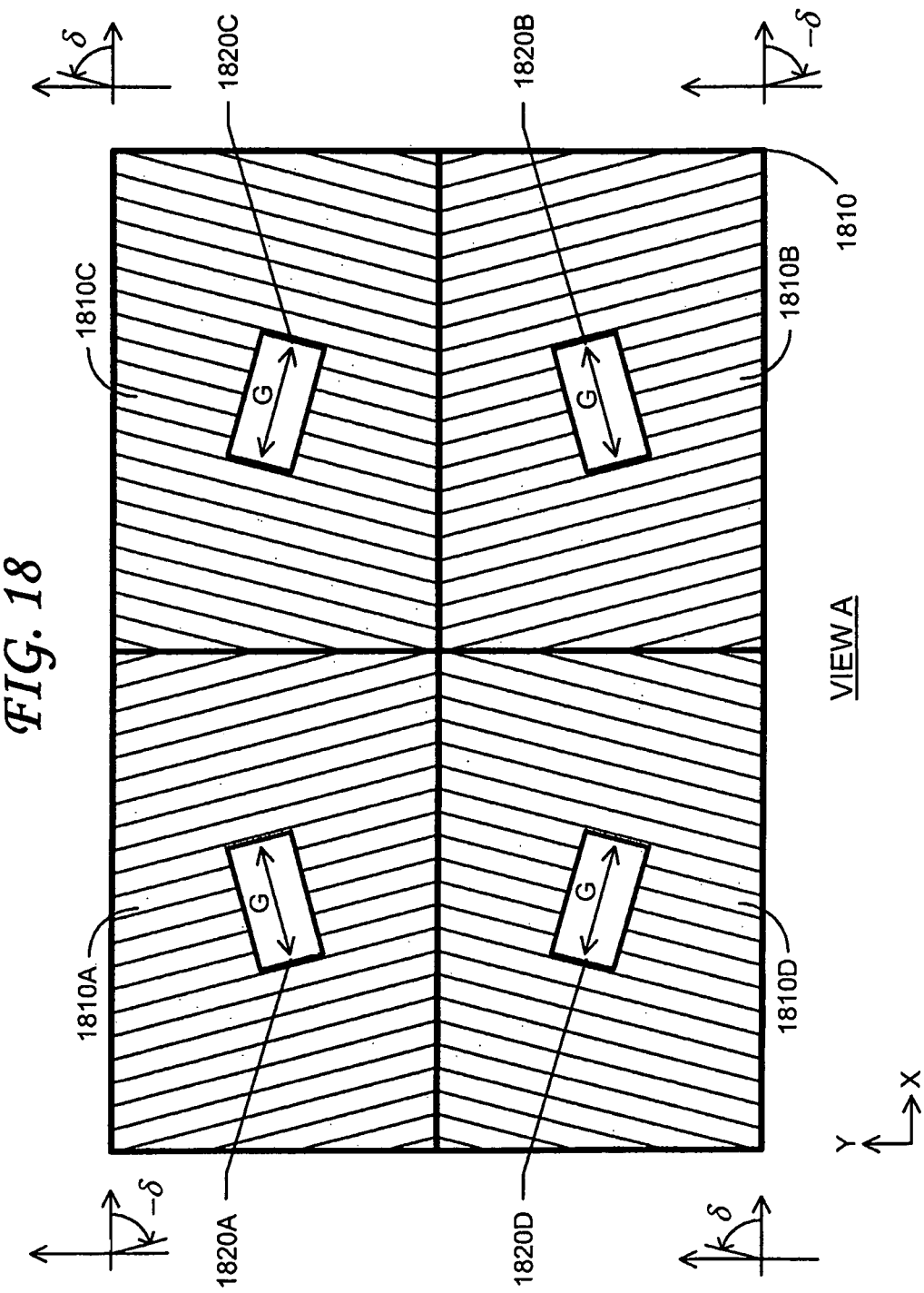

PLANAR MOTOR SYSTEM WITH INCREASED EFFICIENCY

CROSS-REFERENCE TO RELATED APPLICATIONS

This application claims the benefit of U.S. Provisional Application No. 61/710,529, filed Oct. 5, 2012, which is incorporated herein by reference in its entirety.

BACKGROUND OF THE INVENTION

The present invention relates generally to motors, and more particularly to a planar motor system.

Planar motors are used in a variety of commercial and industrial applications. For example, planar motors are used to control the position of substrates in lithographic projection systems, since a planar motor has the desirable combination of fine resolution for positioning control and large translation distances to accommodate a wide range of substrate shapes and sizes. Compact, light-weight, and efficient drive systems for planar motors are advantageous.

BRIEF SUMMARY OF THE INVENTION

In an embodiment of the invention, a planar motor system comprises a platen and a stage. The platen has a planar surface and includes a first planar motor component; the stage includes a second planar motor component. When the stage is driven, it moves parallel to the planar surface of the platen along a first cardinal axis or along a second cardinal axis. The planar motor system further comprises a drive system. When the drive system is energized in a first drive configuration, it applies a first force and a second force to the stage. The first force and the second force are not parallel to the first cardinal axis and are not parallel to the second cardinal axis. A vector sum of the first force and the second force is parallel to the first cardinal axis.

When the drive system is energized in a second drive configuration, it applies a third force and a fourth force to the stage. The third force and the fourth force are not parallel to the first cardinal axis and are not parallel to the second cardinal axis. A vector sum of the third force and the fourth force is parallel to the second cardinal axis. The planar motor system can be configured such that the net force along the first cardinal axis is equal to the net force along the second cardinal axis. The planar motor system can also be configured such that the net force along the first cardinal axis is greater than the net force along the second cardinal axis.

In another embodiment of the invention, a planar motor system comprises a platen and a stage. When the stage is driven, it moves parallel to the planar surface of the platen along a first cardinal axis or along a second cardinal axis. The platen has a planar surface, partitioned into multiple planar regions. In each specific planar region, there is a specific array of ferromagnetic ridges aligned along a specific regional array axis. The stage includes multiple drive units; each specific drive corresponds to a specific planar region. When a specific drive unit is energized, it applies a specific force to the stage; the specific force has a specific force magnitude and a specific force direction orthogonal to the specific regional array axis in the corresponding specific planar region. The net force lies along the first cardinal axis or along the second cardinal axis.

These and other advantages of the invention will be apparent to those of ordinary skill in the art by reference to the following detailed description and the accompanying drawings.

BRIEF DESCRIPTION OF THE DRAWINGS

FIG. 2A and FIG. 2B show schematics of a planar motor;
FIG. 5A-FIG. 5C show schematics of a prior-art stage;
FIG. 7A-FIG. 7D show prior-art force-vector diagrams;
FIG. 10 shows a schematic of a stage and controller, according to an embodiment of the invention;
FIG. 13A and FIG. 13B show an example of boustrophedonic writing;
FIG. 14A-FIG. 14C show schematics of a multi-region platen, according to an embodiment of the invention;
FIG. 17 shows a schematic of a multi-region platen, according to an embodiment of the invention;
FIG. 18 shows a schematic of a multi-region platen, according to an embodiment of the invention.

DETAILED DESCRIPTION

Figure 1A:
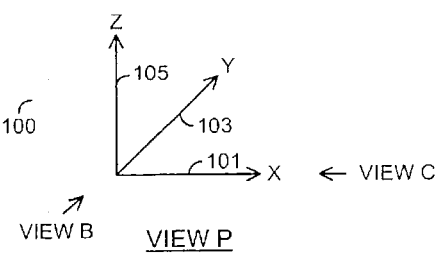
FIG. 1A-FIG. 1D show schematics of a reference Cartesian coordinate system.
Figure 1B:
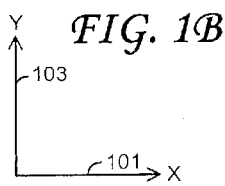
Figure 1C:
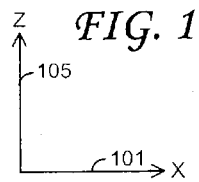
Figure 1D:
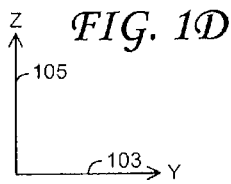

In the descriptions of planar motors below, a three-dimensional (3-D) Cartesian coordinate reference system is used. FIG. 1A shows a perspective view (View P) of the Cartesian coordinate reference system 100, defined by the X-axis 101, the Y-axis 103, and the Z-axis 105. FIG. 1B shows View A, sighted along the axis, of the X-Y plane; FIG. 1C shows View B, sighted along the +Y-axis, of the X-Z plane; and FIG. 1D shows View C, sighted along the −X-axis, of the Y-Z plane. Unless otherwise stated, the origin is arbitrary: in the figures below, reference axes are placed such that they do not interfere with other elements of the figures.

FIG. 2A (View A) and FIG. 2B (View B) show schematics of a planar motor 200, which includes a first component 202 and a second component 212. The first component and the second component can move with respect to each other. In some configurations, the first component and the second component can both move. In typical applications, the first component is referred to as the fixed component 202 (the fixed component is also referred to as a stator), and the second component is referred to as the movable component 212.

For simplicity, the fixed component 202 and the movable component 212 are shown with rectangular geometries; in general, the geometry of each component is arbitrary. Typically, the fixed component is larger than the movable component. In some instances, the fixed component is substantially larger than the movable component; for example, the fixed component can span the floor of a room. In general, however, the relative sizes of the fixed component and the movable component are arbitrary.

The fixed component 202 has a planar (flat) top surface 204 (FIG. 2A and FIG. 2B), and the movable component 212 has a planar bottom surface 214 (FIG. 2B). As described below, however, the top surface 204 of the fixed component 202 and the bottom surface 214 of the movable component 212 can have surface features. Herein, when geometrical conditions are specified, ideal mathematical conditions are not implied. A geometrical condition is satisfied if it is satisfied within a specified tolerance, which can depend, for example, on available manufacturing tolerances, requirements for specific applications, and trade-offs between performance and cost. The tolerance is specified, for example, by a design engineer. For example, a surface is planar (flat) if it is flat within a specified tolerance; two surfaces are parallel if they are parallel within a specified tolerance; and two lines are orthogonal if the angle between them is 90 deg within a specified tolerance.

Refer to FIG. 2B. The movable component 212 is shown above the fixed component 202, separated by a gap 220 between the bottom surface 214 of the movable component 212 and the top surface 204 of the fixed component 202. For example, the movable component can be magnetically or electromagnetically levitated above the fixed component. The movable component can also be supported by a fluid bearing; the fluid can be a gas (such as air or nitrogen) or a liquid (such as water or silicone fluid). In other instances, the movable component can have mechanical contact with the fixed component. For example, the bottom surface 214 of the movable component 212 and the top surface 204 of the fixed component 202 can be coated with a material with a low coefficient of friction (such as a fluoropolymer). In another example, the movable component can be supported on the fixed component by ball bearings. For simplicity, the gap is not shown in the figures below.

Refer to FIG. 2A. The movable component 212 can be moved across the top surface 204 of the fixed component 202. In some configurations of planar motors, the movable component is positioned below the fixed component. For example, the fixed component is supported above a base platform. The fixed component has a planar bottom surface, and the base platform has a planar top surface parallel to the planar bottom surface of the fixed component. The movable component is positioned between the bottom surface of the fixed component and the top surface of the base platform; the movable component is supported above or on the top surface of the base platform. In general, therefore, in a planar motor, the movable component moves along a surface parallel to a planar surface of the fixed component.

The movable component moves in response to a motive force provided by a drive system (not shown). The drive system can be mounted on the movable component, on the fixed component, or on both the movable component and the fixed component. A specific example of a drive system is described below.

The drive system typically moves the movable component along two orthogonal principal axes (principal axes are also referred to as cardinal axes, specified directions of motion, or preferred directions of motion). For example, the principal axes can be the X-axis and the Y-axis. When the movable component moves from a first position to a second position, for example, it can move a first interval along the X-axis, followed by a second interval along the Y-axis; alternatively, it can move a first interval along the Y-axis, followed by a second interval along the X-axis.

Figure 3:
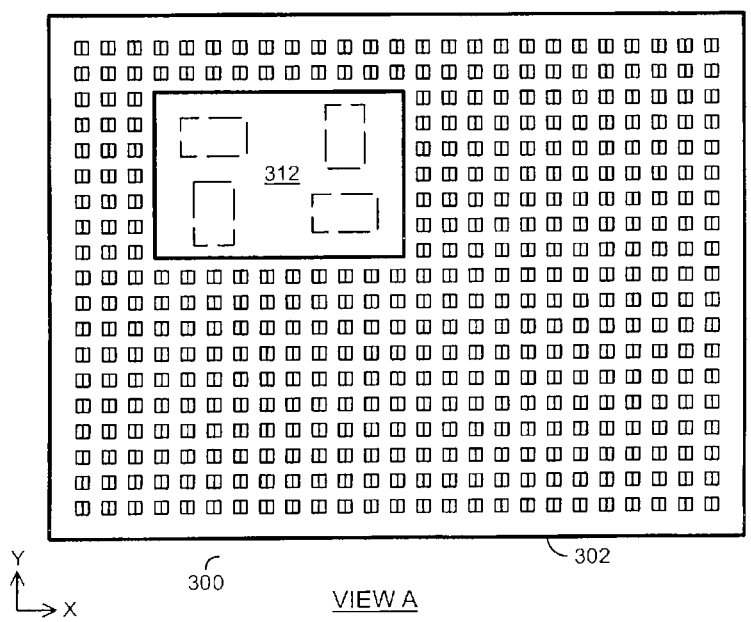
FIG. 3 shows a schematic of a prior-art planar motor.

FIG. 3 (View A) shows a schematic of a prior-art planar motor 300 used in a lithographic projection system. Details are given in U.S. Pat. No. 5,828,142, which is herein incorporated by reference; a summary is first presented to expedite descriptions of embodiments of the invention below. The planar motor 300 includes a fixed component, referred to as the platen 302, and a movable component, referred to as the stage 312. The stage 312 is supported above the platen 302 by an air bearing.

Figure 4A:
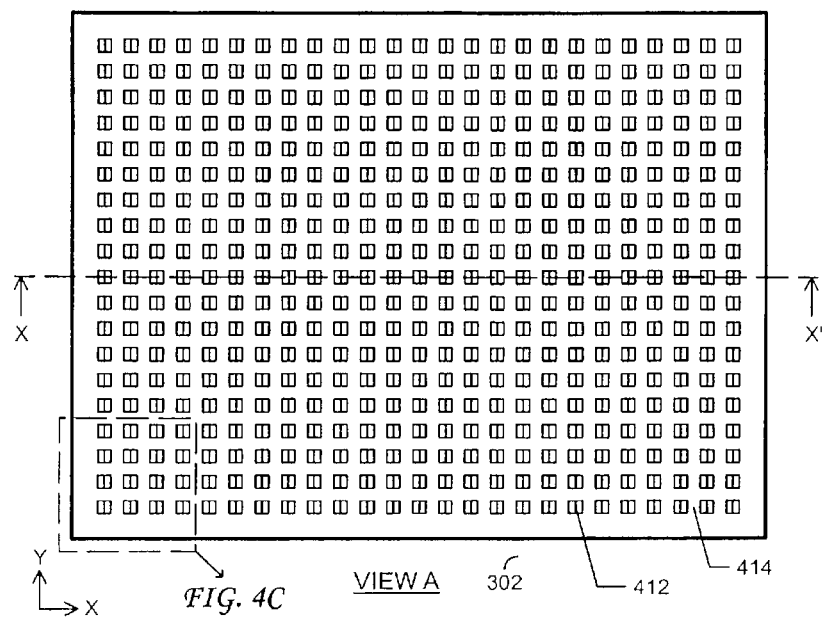
FIG. 4A-FIG. 4D show schematics of a prior-art platen.
Figure 4B:
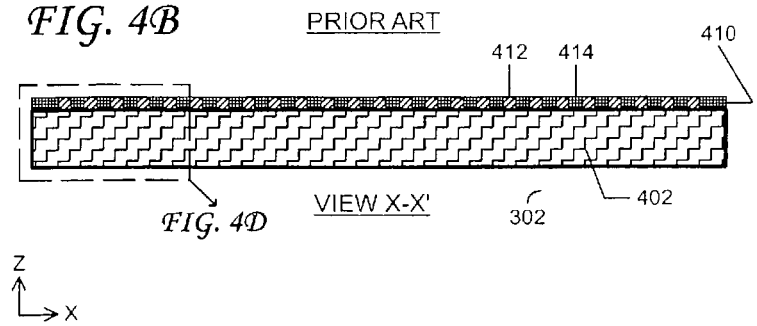
Figure 4C:
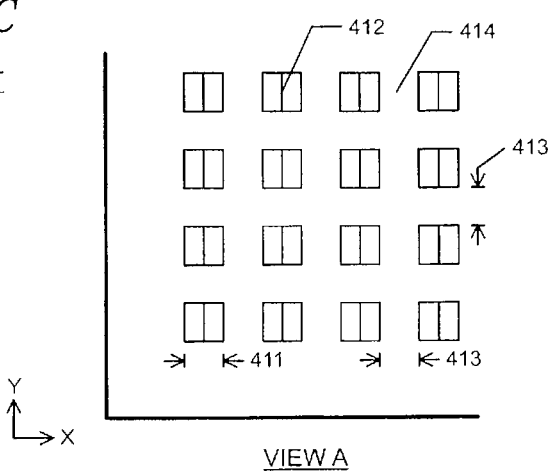
Figure 4D:
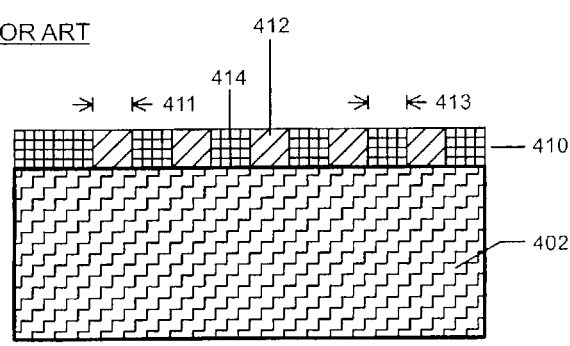

FIG. 4A-FIG. 4D show details of the platen 302. FIG. 4A shows View A; FIG. 4B shows a cross-sectional view (View X-X'); FIG. 4C shows a close-up view of a portion of FIG. 4A; and FIG. 4D shows a close-up view of a portion of FIG. 4B. Refer to FIG. 4A and FIG. 4B. The platen 302 includes the base plate 402 and the surface layer 410. The base plate 402 is fabricated from a ferromagnetic material. The surface layer 410 includes an array of teeth 412, fabricated from a ferromagnetic material. The spaces between the teeth are filled with the filler 414, fabricated from a non-magnetic material, such as epoxy resin. In some designs (such as when capacitive position sensors are incorporated into platen), the filler material is also non-conductive.

Refer to FIG. 4C and FIG. 4D. Each tooth in the array of teeth 412 is a square, with sides parallel to the X-axis and the Y-axis. The teeth form a rectangular array with rows and columns parallel to the X-axis and the Y-axis, respectively. The spacing 413 between teeth is equal to the width 411 of a tooth; the spacing between teeth along the X-axis is equal to the spacing between teeth along the Y-axis.

FIG. 5A-FIG. 5C show details of the stage 312. FIG. 5A shows View A; FIG. 5B shows View B; and FIG. 5C shows View C. The stage 312 includes the platform 502. Mounted on the underside of the platform 502 are four drive units, also referred to as forcers, referenced as drive unit 510, drive unit 512, drive unit 520, and drive unit 522. Further details of the drive units are described below.

Refer to FIG. 5A. When the drive units are energized, they provide a motive force that propels the stage 312 across the surface of the platen 302 (FIG. 3). Each drive unit is bidirectional and exerts a force with a magnitude F. For the drive unit 510, the force 511 acts along the X-axis; for the drive unit 512, the force 513 acts along the X-axis; for the drive unit 520, the force 521 acts along the Y-axis; and for the drive unit 522, the force 523 acts along the Y-axis.

Figure 6D:
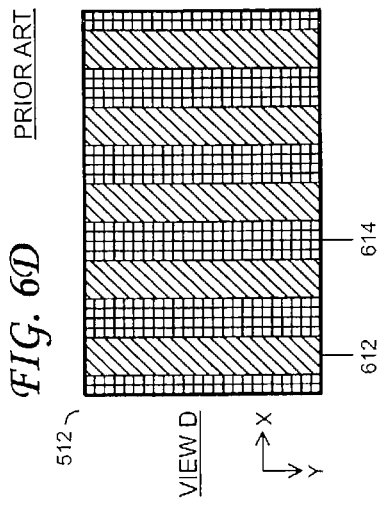
FIG. 6A-FIG. 6D show schematics of a prior-art drive unit.
Figure 6C:
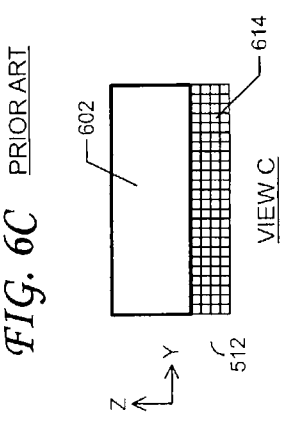
Figure 6A:
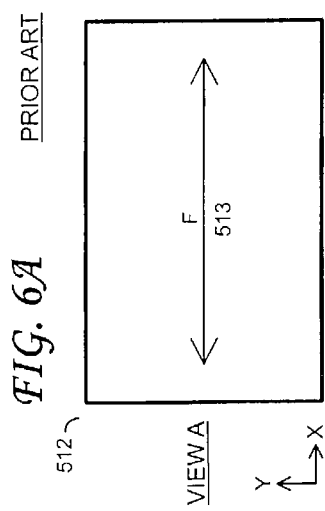
Figure 6B:
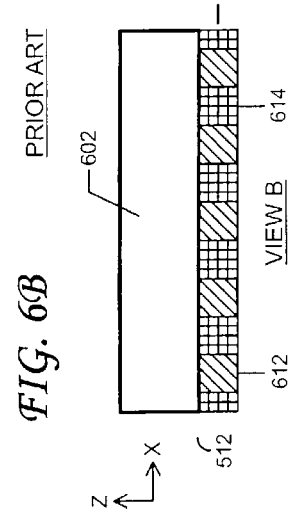

Details of a representative drive unit, drive unit 512, are shown in FIG. 6A-FIG. 6D. FIG. 6A shows View A; FIG. 6B shows View B; FIG. 6C shows View C, and FIG. 6D shows View D. View D is a bottom view, sighted along the +Z-axis. The drive unit 512 includes the base plate 602 and the surface layer 610. The base plate 602 is fabricated from a ferromagnetic material. The surface layer 610 includes an array of ridges 612, fabricated from a ferromagnetic material. The spaces between the ridges are filled with the filler 614, fabricated from a non-magnetic material, such as epoxy resin. In some designs, the filler material is also non-conductive. Instead of an array of ridges, an array of teeth can be used.

An array of electromagnetic coils (not shown) is embedded in the drive unit 512. When the electromagnetic coils are energized, there is electromagnetic coupling between the array of ridges 610 on the drive unit 512 and the array of teeth 412 on the platen 302 (FIG. 4A). The array of ridges is aligned along the Y-axis and couple to columns of teeth aligned along the Y-axis. The net force 513 is orthogonal to the orientation of the ridges and teeth; that is, the net force 513 is along the X-axis.

Similarly, for the drive unit 520, the array of ridges on the drive unit is aligned along the X-axis and couple to rows of teeth aligned along the X-axis. The net force 521 is orthogonal to the orientation of the ridges and teeth; that is the net force 521 is along the Y-axis.

Refer to the force-vector diagrams shown in FIG. 7A-FIG. 7D. For simplicity, the stage 312 is represented by a filled circle. The cardinal axes are the X-axis and the Y-axis, and the force vectors are optimally oriented with respect to the cardinal axes: that is, the motive force provided by each drive unit is aligned along one of the cardinal axes. The net force vectors are obtained by appropriate switching configurations of the drive units (FIG. 5A). Herein the net force vector refers to the vector sum (also referred to as the resultant) of individual force vectors.

In FIG. 7A, drive unit 520 and drive unit 522 are switched off; drive unit 510 and drive unit 512 are switched on, each providing a motive force with a magnitude F in the +X direction. The net force 701, with a magnitude 2F, is applied to the stage 312 for a specified time interval, causing it to translate an interval ΔX 711. In FIG. 7B, drive unit 520 and drive unit 522 are switched off; drive unit 510 and drive unit 512 are switched on, each providing a motive force with a magnitude F in the −X direction. The net force 703, with a magnitude 2F, is applied to the stage 312 for a specified time interval, causing it to translate an interval ΔX 713. [Note: In some instances, an applied force can cause a braking action to retard motion; and, in some instances, an applied force can be used to hold a stage stationary. For the examples described herein, a motive force applied over a specified time interval causes a net translation of the stage.]

In FIG. 7C, drive unit 510 and drive unit 512 are switched off; drive unit 520 and drive unit 522 are switched on, each providing a motive force with a magnitude F in the +Y direction. The net force 705, with a magnitude 2F, is applied to the stage 312 for a specified time interval, causing it to translate an interval ΔY 715. In FIG. 7D, drive unit 510 and drive unit 512 are switched off; drive unit 520 and drive unit 522 are switched on, each providing a motive force with a magnitude F in the −Y direction. The net force 707, with a magnitude 2F, is applied to the stage 312 for a specified time interval, causing it to translate an interval ΔY 717.

Figure 8:
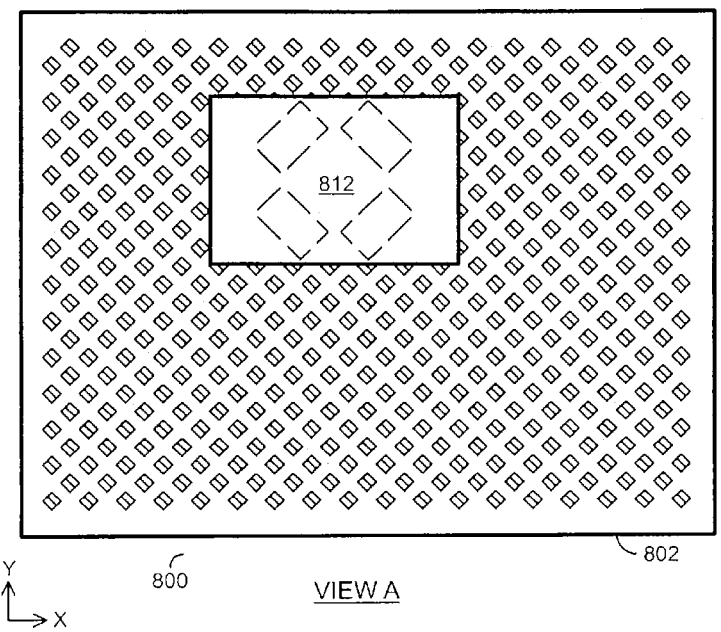
FIG. 8 shows a schematic of a planar motor according to an embodiment of the invention.

FIG. 8 (View A) shows a schematic of a planar motor 800 according to an embodiment of the invention. The planar motor 800 includes a fixed component, referred to as the platen 802, and a movable component, referred to as the stage 812. The stage 812 is supported above the platen 802 by an air bearing.

Figure 9A:
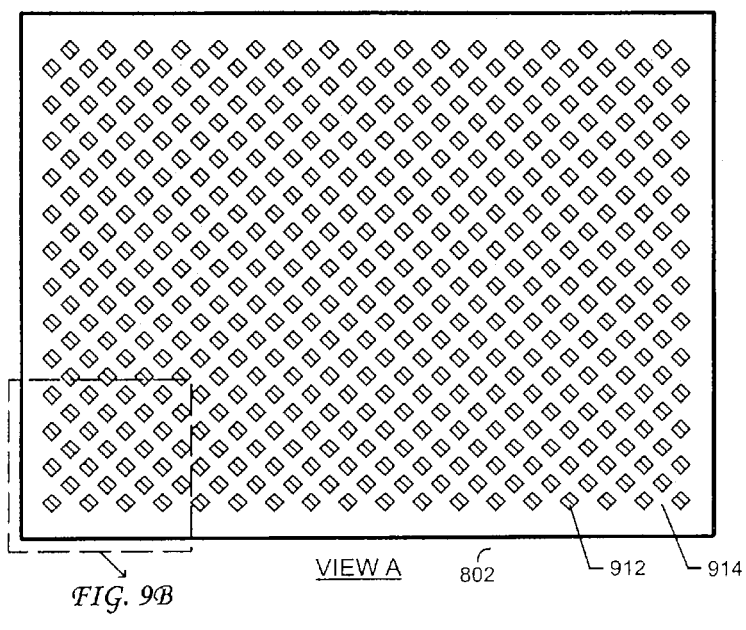
FIG. 9A-FIG. 9C show schematics of a platen, according to an embodiment of the invention.
Figure 9B:
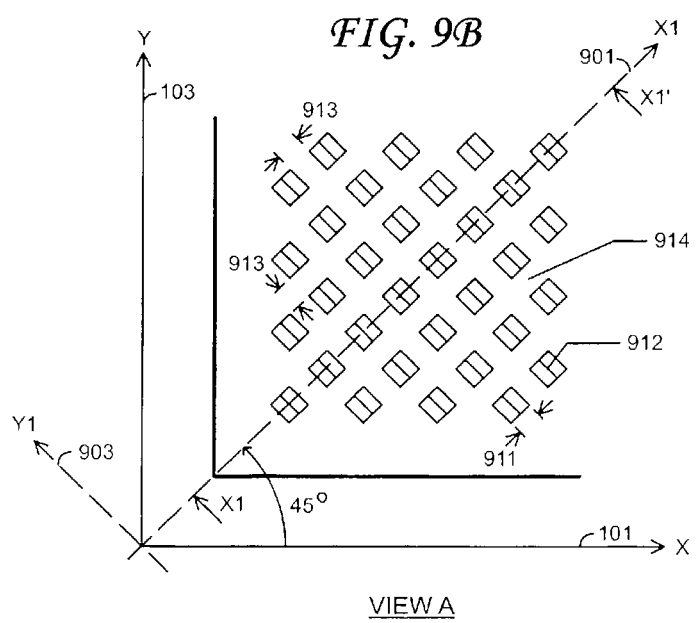
Figure 9C:
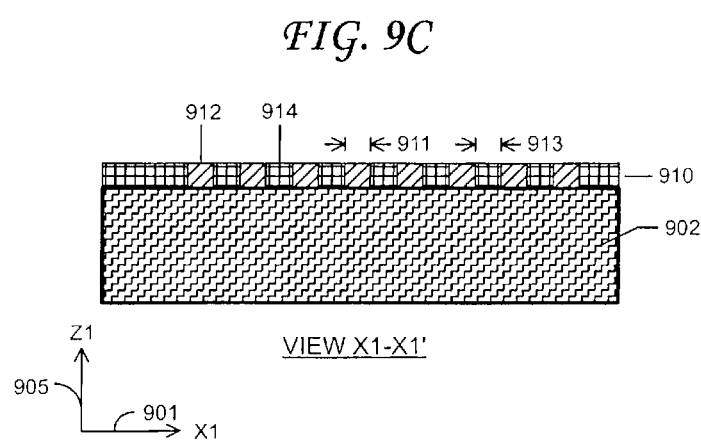

FIG. 9A-FIG. 9C show details of the platen 802. FIG. 9A shows View A; FIG. 9B shows a close-up view of a portion of FIG. 9A; FIG. 9C shows a close-up view of a portion of a cross-sectional view (View X1-X1'). Refer to FIG. 9C. The platen 802 includes the base plate 902 and the surface layer 910. The base plate 902 is fabricated from a ferromagnetic material. The surface layer 910 includes an array of teeth 912, fabricated from a ferromagnetic material. The spaces between the teeth are filled with the filler 914, fabricated from a non-magnetic material, such as epoxy resin. In some designs, the filler material is also non-conductive.

Refer to FIG. 9B and FIG. 9C. The array of teeth 912 is oriented with respect to a Cartesian coordinate system defined by the X1-axis 901, the Y1-axis 903, and the Z1-axis 905. The Z1-axis is parallel to the Z-axis, and the X1-Y1 axes (referred to as the array axes) are rotated with respect to the X-Y axes by +45 deg (counter-clockwise). Each tooth in the array of teeth 912 is a square, with sides parallel to the X1-axis and the Y1-axis. The teeth form a rectangular array with rows and columns parallel to the X1-axis and the Y1-axis, respectively. The spacing 913 between teeth is equal to the width 911 of a tooth. In the example shown, the spacing between teeth along the X1-axis is equal to the spacing between teeth along the Y1-axis. In general, the shape and size of a tooth, the geometrical configuration of the array, and the spacing between teeth can vary.

FIG. 10 (View A) show details of the stage 812. The stage 812 includes the platform 1002. Mounted on the underside of the platform 1002 are four drive units, also referred to as forcers, referenced as drive unit 1010, drive unit 1012, drive unit 1020, and drive unit 1022. Each drive unit is similar to the drive unit 512 described above; however, they are oriented differently. When the drive units are energized, they provide a motive force that propels the stage 812 across the surface of the platen 802 (FIG. 8). Each drive unit is bidirectional and exerts a force with a magnitude F. In general, the magnitude of the force exerted by each drive unit can be different. For the drive unit 1010, the force 1011 acts along the X1-axis; for the drive unit 1012, the force 1013 acts along the X1-axis; for the drive unit 1020, the force 1021 acts along the Y1-axis; and for the drive unit 1022, the force 1023 acts along the Y1-axis. The drive units are controlled by the controller 1050, details of which are described below. The drive units and controller are part of a drive system, which can be energized in various drive configurations in response to commands from the controller.

Refer to the force-vector diagrams shown in FIG. 11A-FIG. 11H. For simplicity, the stage 812 is represented by a filled circle. The cardinal axes are the X-axis and the Y-axis, but the force vectors are not optimally oriented with respect to the cardinal axes: that is, the motive force provided by each drive unit is not aligned along one of the cardinal axes. The net force vectors are obtained by appropriate switching configurations of the drive units under the control of the controller 1050 (FIG. 10).

Figure 11C:
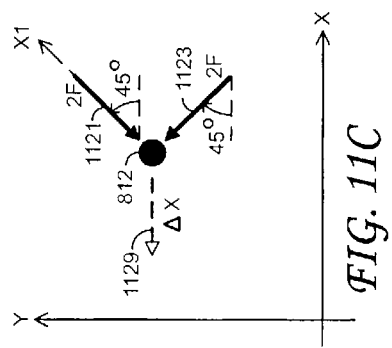
FIG. 11A-FIG. 11H show force-vector diagrams, according to embodiments of the invention.
Figure 11D:
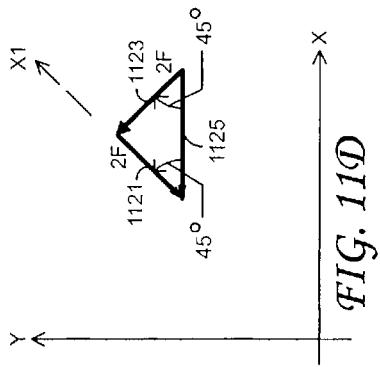
Figure 11A:
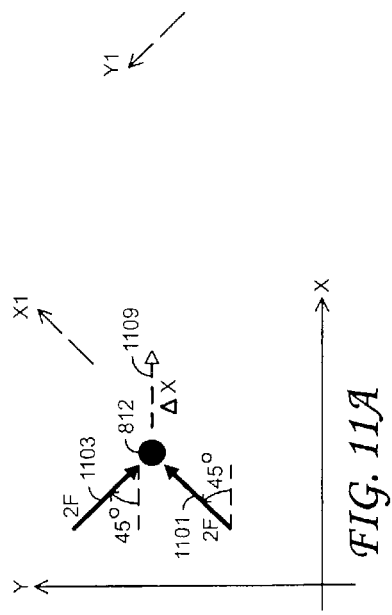
Figure 11B:
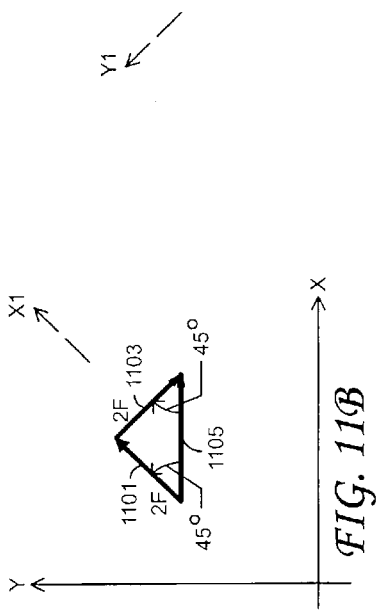

Refer to FIG. 11A and FIG. 11B. Drive unit 1010 and drive unit 1012 are switched on, each providing a motive force with a magnitude F in the +X1 direction; and drive unit 1020 and drive unit 1022 are switched on, each providing a motive force with a magnitude F in the −Y1 direction. Consequently, the force 1101, with a magnitude 2F, is applied along the +X1 direction; and the force 1103, with a magnitude 2F, is applied along the −Y1 direction. The net force 1105, with a magnitude 4F) cos(45°)=2.83F, is applied to the stage 812 along the +X direction for a specified time interval, causing it to translate an interval ΔX 1109.

Refer to FIG. 11C and FIG. 11D. Drive unit 1010 and drive unit 1012 are switched on, each providing a motive force with a magnitude F in the −X1 direction; and drive unit 1020 and drive unit 1022 are switched on, each providing a motive force with a magnitude F in the +Y1 direction. Consequently, the force 1121, with a magnitude 2F, is applied along the −X1 direction; and the force 1123, with a magnitude 2F, is applied along the +Y1 direction. The net force 1125, with a magnitude 4F cos(45°)=2.83F, is applied to the stage 812 along the −X direction for a specified time interval, causing it to translate an interval ΔX 1129.

Figure 11E:
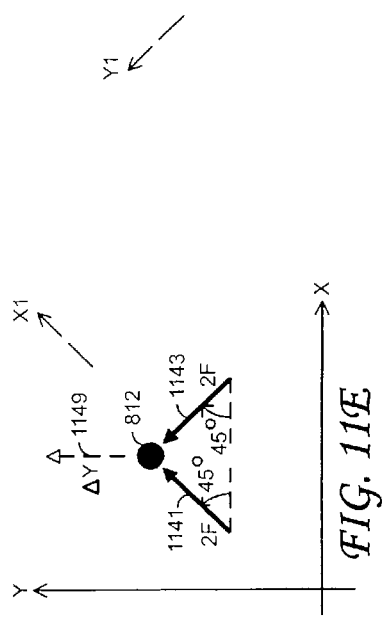
Figure 11F:
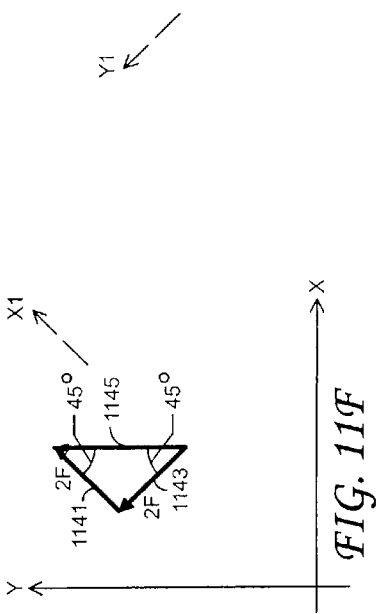

Refer to FIG. 11E and FIG. 11F. Drive unit 1010 and drive unit 1012 are switched on, each providing a motive force with a magnitude F in the +X1 direction; and drive unit 1020 and drive unit 1022 are switched on, each providing a motive force with a magnitude F in the +Y1 direction. Consequently, the force 1141, with a magnitude 2F, is applied along the +X1 direction; and the force 1143, with a magnitude 2F, is applied along the +Y1 direction. The net force 1145, with a magnitude 4F cos(45°)=2.83F, is applied to the stage 812 along the +Y direction for a specified time interval, causing it to translate an interval ΔY 1149.

Figure 11G:
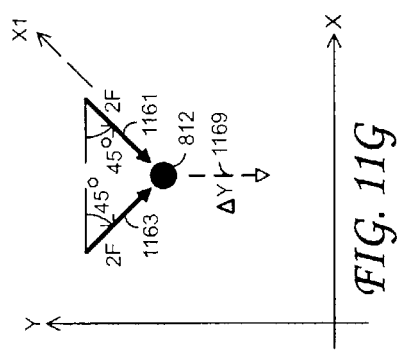
Figure 11H:
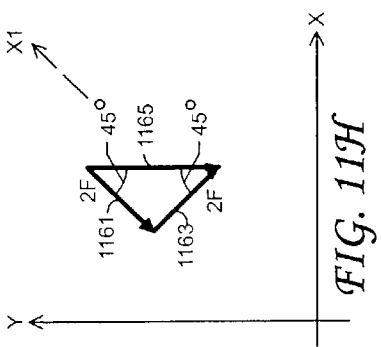

Refer to FIG. 11G and FIG. 11H. Drive unit 1010 and drive unit 1012 are switched on, each providing a motive force with a magnitude F in the −X1 direction; and drive unit 1020 and drive unit 1022 are switched on, each providing a motive force with a magnitude F in the −Y1 direction. Consequently, the force 1161, with a magnitude 2F, is applied along the −X1 direction; and the force 1163, with a magnitude 2F, is applied along the −Y1 direction. The net force 1165, with a magnitude 4F cos(45°)=2.83F, is applied to the stage 812 along the −Y direction for a specified time interval, causing it to translate an interval ΔY 1169.

The size, weight, and power consumption of a drive unit are important design parameters. Compare the planar motor 800 with the prior-art planar motor 300. In both instances, the stage includes four drive units, each providing a motive force with a magnitude F. In the planar motor 300, the net force along each of the cardinal axes (X-axis and Y-axis) has a magnitude 2F. In the planar motor 800, however, the net force along each of the cardinal axes (X-axis and Y-axis) is 2.83F. Therefore, the net force is increased without increasing the size, weight, or maximum power consumption of each drive unit (the total power consumption of all the drive units will increase, however, due to higher duty cycle).

In the planar motor 800, the cardinal axes (X-axis and Y-axis) are symmetric, and the net force along the X-axis is equal to the net force along the Y-axis. In another embodiment of the invention, the cardinal axes are asymmetric, and the net force along the X-axis is not equal to the net force along the Y-axis. In some applications, an example of which is described below, the translation along one cardinal axis is substantially greater (in distance, in duty cycle, or in both distance and duty cycle) than along the other cardinal axis. The X-axis is designated as the primary cardinal axis, and the Y-axis is designated as the secondary cardinal axis. The X-axis and the Y-axis in the example below are orthogonal; in general, however, the primary cardinal axis and the secondary cardinal axis do not need to be orthogonal.

Figure 12A:
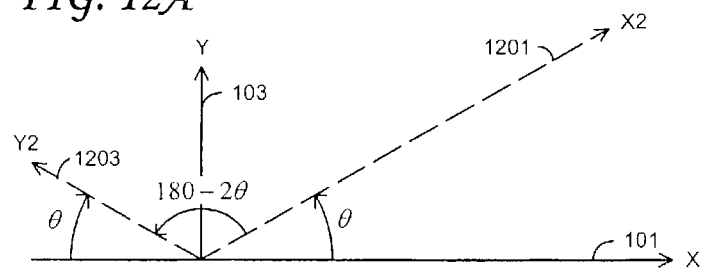
FIG. 12A-FIG. 12C show force-vector diagrams, according to embodiments of the invention.

Refer to the reference coordinate diagram shown in FIG. 12A. Shown are the primary cardinal axis 101 (X-axis) and the secondary cardinal axis 103 (Y-axis). Also shown are the reference axis 1201 (X2-axis) and the reference axis 1203 (Y2-axis); the X2 and Y2 reference axes are also referred to as array axes). The X2-axis is rotated by θ deg (counter-clockwise) from the X-axis. The Y2 axis is rotated by (180−2θ) deg from the X2-axis; in general, the X2-axis and the Y2-axis are not orthogonal.

Figure 12B:
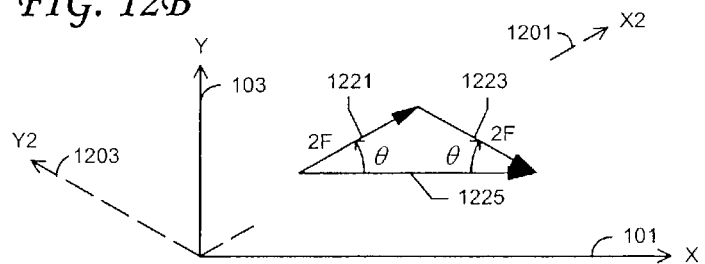

Refer to the force-vector diagram shown in FIG. 12B. The force 1221, with a magnitude 2F, is applied along the +X2 direction; and the force 1223, with a magnitude 2F, is applied along the −Y2 direction. The net force 1225, with a magnitude $F_X$=4F cos θ, is applied to the stage along the +X direction.

Figure 12C:
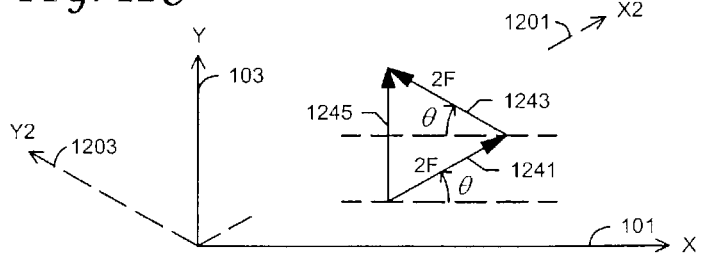

Refer to the force-vector diagram shown in FIG. 12C. The force 1241, with a magnitude 2F, is applied along the +X2 direction; and the force 1243, with a magnitude 2F, is applied along the +Y2 direction. The net force 1245, with a magnitude $F_Y$=4F sin θ, is applied to the stage along the +Y direction.

The ratio of $F_X/F_Y$ is therefore cot θ. Some representative values are shown in Table 1 below:

TABLE 1

FORCE VALUES AS A FUNCTION OF ANGLE

| ANGLE θ (deg) | $F_X/F = 4\cos\theta$ | $F_Y/F = 4\sin\theta$ | $F_X/F_Y = \cot\theta$ |
|---|---|---|---|
| 10 | 3.94 | 0.69 | 5.67 |
| 20 | 3.76 | 1.37 | 2.75 |
| 30 | 3.46 | 2.00 | 1.73 |
| 45 | 2.83 | 2.83 | 1.00 |

FIG. 13A and FIG. 13B illustrate an example in which greater force along the primary cardinal axis is advantageous. Patterns are written onto the surface of a substrate 1302 by an optical or electron beam. Refer to FIG. 13A. The substrate 1302 is rectangular, with the dimension along the X-axis substantially greater than the dimension along the Y-axis. Writing proceeds according to a boustrophedonic sequence. Starting at point 1301, writing proceeds from left to right along the X-axis to point 1303. Refer to FIG. 13B. The beam 1321 is held stationary, and the substrate 1302, which is carried on a substrate stage (not shown), is moved from right to left. The substrate 1302 is then stepped along the Y-axis, such that point 1305 is positioned under the beam 1321. Writing then proceeds from right to left from point 1305 to point 1307 by moving the substrate 1302 from left to right. The substrate 1302 is then stepped along the Y-axis, such that point 1309 is positioned under the beam 1321. The writing sequence then continues.

Both the travel distance and the duty cycle along the X-axis are substantially greater than the travel distance and the duty cycle along the Y-axis. A greater motive force along the X-axis, relative to the motive force along the Y-axis, is therefore advantageous. [Note: Even when the dimension along the X-axis is comparable to or less than the dimension along the Y-axis, a greater motive force along the X-axis, relative to the motive force along the Y-axis, is advantageous if the duty cycle along the X-axis is greater than the duty cycle along the Y-axis; for example, if the stage moves at least two steps along the X-axis at each Y-position.]

Refer back to FIG. 9B and FIG. 10. By changing the orientation of the array of teeth on the platen, and the corresponding orientation of the drive units, with respect to the cardinal axes (X-axis and Y-axis), the motive force along the X-axis can be increased, while maintaining, the size, weight, and maximum power consumption of each drive unit (the total power consumption of all the drive units will be greater, however, due to increased duty cycle). In the platen 802 (FIG. 9A), the surface of the platen is uniform; that is, the array of teeth is uniform across the surface of the platen. In other embodiments of the invention, the surface of the platen is not uniform; instead, the surface of the platen includes multiple regions that allow the array of teeth to be replaced by arrays of ridges. Each region has an array of ridges oriented along a specific direction.

Figure 22C:
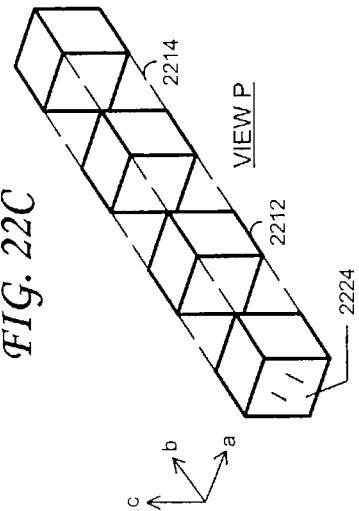
FIG. 22A-FIG. 22D show a comparison between a ridge and a row of teeth.
Figure 22D:
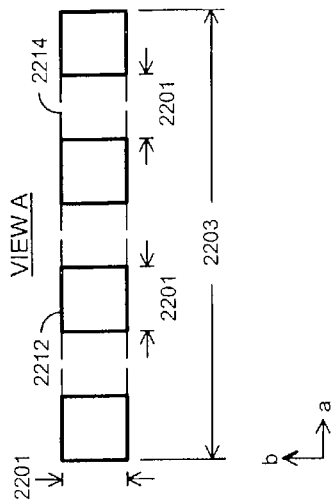
Figure 22A:
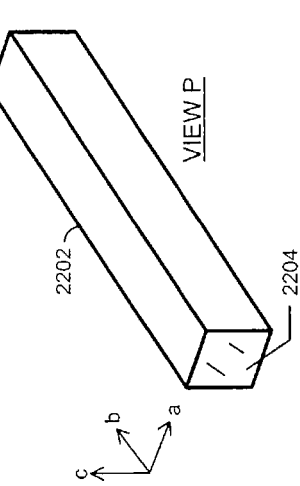
Figure 22B:
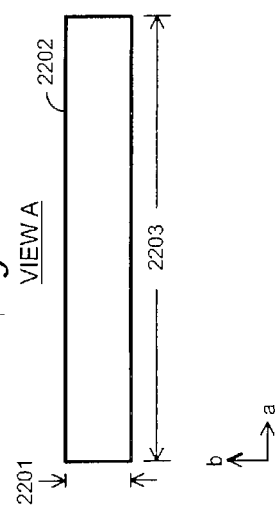

The advantage of a ridge over a row of teeth is shown in FIG. 22A-FIG. 22D. A local Cartesian reference coordinate system with a-b-c axes is shown. FIG. 22A (View B, perspective view) and FIG. 22B (View A, sighted along the –c axis) show schematics of a ridge 2202, which, in this example, has the geometry of a longitudinally extended (elongated) square prism. The end face 2204, which lies parallel to the a-c plane, has the geometry of a square; the side of the square has a dimension 2201. The longitudinal axis lies along the b-axis. The longitudinal dimension 2203 is substantially greater than the dimension 2201. In general, a ridge can have a longitudinally extended geometry, with an arbitrary cross-sectional shape.

FIG. 22C (View P) and FIG. 22D (View C) show a corresponding row of teeth 2212, separated by the gaps 2214. Each tooth is a cube, with the end face 2224 having the same dimensions as the end face 2204 of the ridge. Each gap is also a cube, with the same edge dimension 2201. The total longitudinal length of the row of teeth is the same as that of the ridge 2202 (dimension 2203).

Comparison of the ridge 2202 with the row of teeth 2212 shows that the ridge 2202 has more volume and more surface area of ferromagnetic material. The motive force generated by electromagnetic coupling between a drive unit and the platen is proportional to the volume and surface area of ferromagnetic structures on the surface of the platen. For the same drive unit operating under the same power consumption, the motive force will be greater for a platen with ridges than for a platen with teeth. Alternatively, to achieve the same motive force, a drive unit can be operated at lower power consumption for a platen with ridges than for a platen with teeth.

As discussed above in regard to the platen 302 and the platen 802, an array of teeth allows electromagnetic coupling with drive units oriented in different directions. An array of ridges on the platen, however, primarily provides electromagnetic coupling with a drive unit whose array of ridges is aligned with the array of ridges on the platen. In an embodiment of the invention, the platen includes multiple planar regions (unless otherwise stated, a planar region is also referred to simply as a region). The orientation of the array of ridges in each region can be independently specified; the array of ridges in each region is aligned along a regional array axis. A separate drive unit operates across a corresponding region; the drive unit can be positioned on, above, or below its corresponding region. The drive unit in each corresponding region is aligned with the array of ridges in the corresponding region to maximize the motive force. The direction of the motive force is orthogonal to the regional array axis of the corresponding region.

Refer to FIG. 14A. The platen 1410 includes four regions, referenced as region 1410A, region 1410B, region 1410C, and region 1410D. For simplicity, the ridges are represented by line segments. In the region 1410A, the ridges are oriented at −45 deg (clockwise) from the X-axis. The drive unit 1420A applies a force, with a magnitude G, orthogonal to the ridges. In the region 1410B, the ridges are oriented at −45 deg from the X-axis. The drive unit 1420B applies a force, with a magnitude G, orthogonal to the ridges. In the region 1410C, the ridges are oriented at +45 deg (counter-clockwise) from the X-axis. The drive unit 1420C applies a force, with a magnitude G, orthogonal to the ridges. In the region 1410D, the ridges are oriented at +45 deg from the X-axis. The drive unit 1420D applies a force, with a magnitude G, orthogonal to the ridges. In general, the magnitude of the force applied by each drive unit can be different.

Figure 14B:
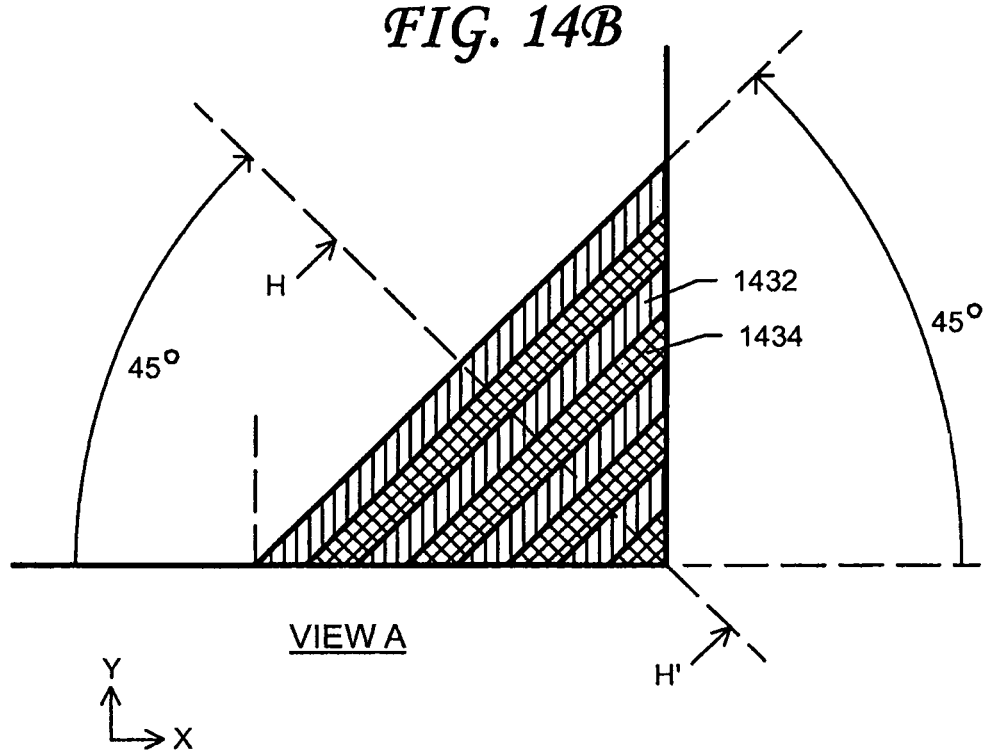
Figure 14C:
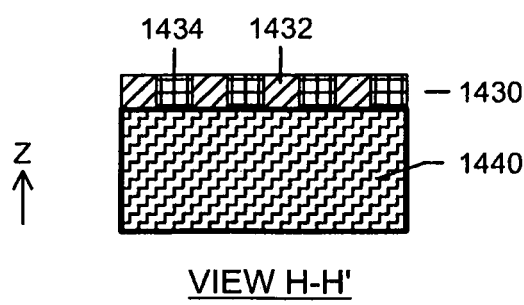

FIG. 14B (View A) shows a close-up view of a portion of region 1410C. FIG. 14C (View H-H') shows a cross-sectional view. The region 1410C includes a base plate 1440 and a surface layer 1430. The base plate 1440 is fabricated from a ferromagnetic material. The surface layer 1430 includes an array of ridges 1432 fabricated from a ferromagnetic material. The gaps between ridges are filled with the filler 1434, fabricated from a non-magnetic material, such as epoxy resin. In some designs, the filler material is also non-conductive.

Figure 15:
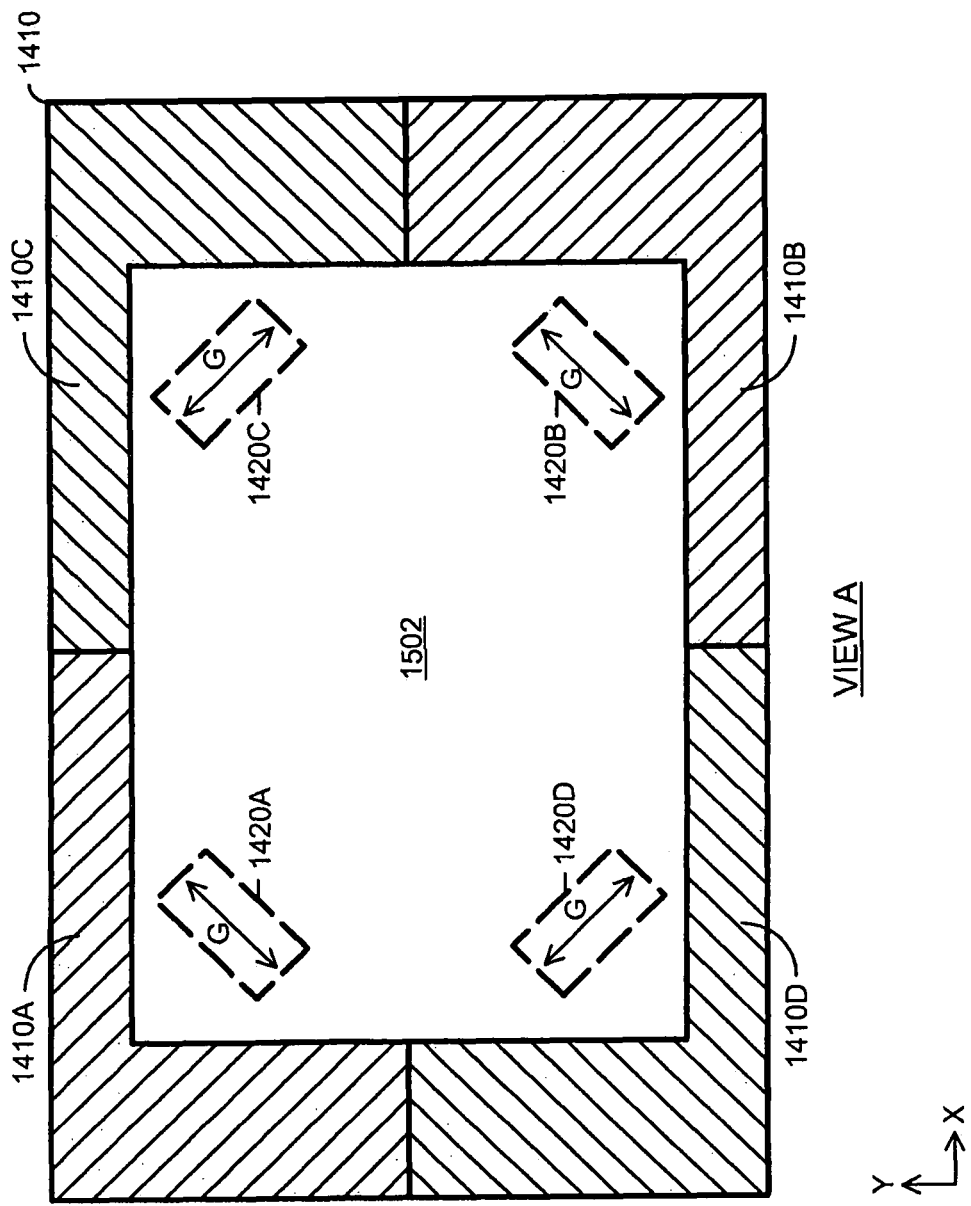
FIG. 15 shows a schematic of a planar motor with a multi-region platen, according to an embodiment of the invention.
Figure 16:
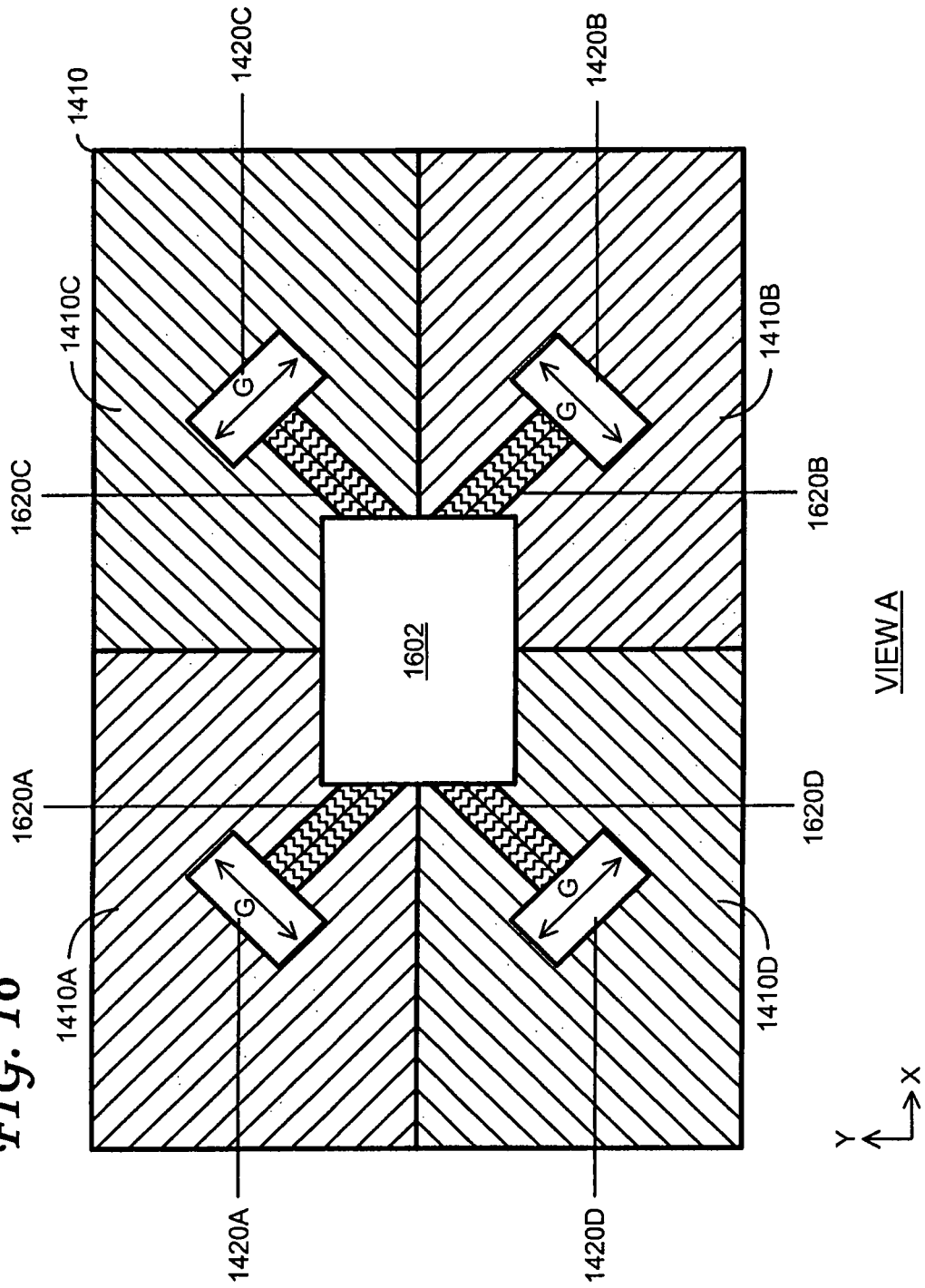
FIG. 16 shows a schematic of a planar motor with a multi-region platen, according to an embodiment of the invention.

FIG. 15 shows an embodiment of the invention, referred to as an on-board configuration, in which the drive units (1420A, 1420B, 1420B, and 1420C) are attached to the underside of the platform 1502. FIG. 16 shows an embodiment of the invention, referred to as an outrigger configuration, in which the drive units (1420A, 1420B, 1420B, and 1420C) are attached to the platform 1602 by arms (1620A, 1620B, 1620C, and 1620D, respectively). If the individual force vectors are summed, the force-vector diagrams are similar to those previously shown in FIG. 11A-FIG. 11H: the net force along each of the cardinal axes (X-axis and Y-axis) is 2.83G.

FIG. 17 shows an embodiment in which the platen 1710 includes four regions. In the region 1710A, the ridges are oriented along the Y-axis. The drive unit 1720A applies a force, with a magnitude G, along the X-axis. In the region 1710B, the ridges are oriented along the Y-axis. The drive unit 1720B applies a force, with a magnitude G, along the X-axis. In the region 1710C, the ridges are oriented along the X-axis. The drive unit 1720C applies a force, with a magnitude G, along the Y-axis. In the region 1710D, the ridges are oriented along the X-axis. The drive unit 1720D applies a force, with a magnitude G, along the Y-axis. A platform can be attached to the drive units in an on-board configuration or an outrigger configuration. The force-vector diagrams are therefore similar to those shown in FIG. 7A-FIG. 7D: the net force along each of the cardinal axes (X-axis and Y-axis) is 2G, where 2G>2F due to the use of ridges instead of teeth.

FIG. 18 shows an embodiment in which the platen 1810 includes four regions. In the region 1810A, the ridges are oriented at −δ deg (clockwise) from the X-axis. The drive unit 1820A applies a force, with a magnitude G, orthogonal to the ridges. In the region 1810B, the ridges are oriented at −δ deg from the X-axis. The drive unit 1820B applies a force, with a magnitude G, orthogonal to the ridges. In the region 1810C, the ridges are oriented at +δ deg (counter-clockwise) from the X-axis. The drive unit 1820C applies a force, with a magnitude G, orthogonal to the ridges. In the region 1810D, the ridges are oriented at +δ deg from the X-axis. The drive unit 1820D applies a force, with a magnitude G, orthogonal to the ridges.

Figure 19A:
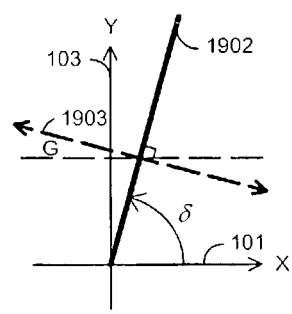
FIG. 19A-FIG. 19C show force-vector diagrams and reference axes, according to an embodiment of the invention.
Figure 19B:
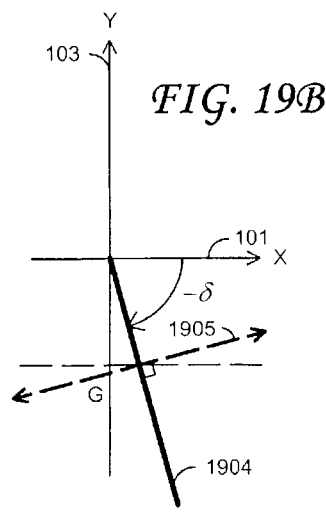
Figure 19C:
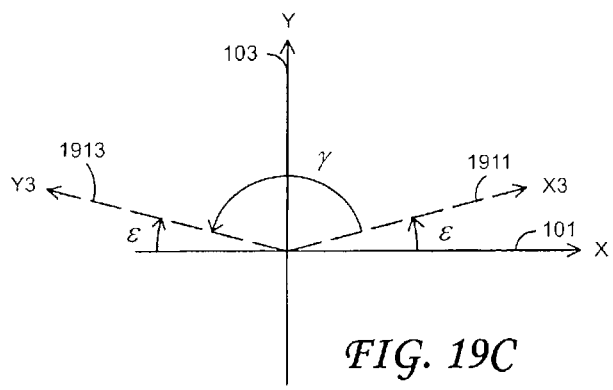

FIG. 19A-FIG. 19C show further details of the geometry. In FIG. 19A, the ridge 1902 is oriented at +δ deg from the X-axis; the force 1903, with a magnitude G, is orthogonal to the ridge 1902. In FIG. 19B, the ridge 1904 is oriented at −δ deg from the X-axis; the force 1905, with a magnitude G, is orthogonal to the ridge 1904. FIG. 19C shows the axes along which forces are applied: the X3-axis 1911 and the Y3-axis 1913. The X3-axis is rotated by +ε deg from the X-axis. The Y3-axis rotated by +γ deg from the X3-axis. Consideration of the geometries in FIG. 19A and FIG. 19B shows that ε=90−δ and γ=2δ.

A platform can be attached to the drive units in an on-board configuration or an outrigger configuration. The force-vector diagrams are therefore similar to those shown in FIG. 12A-FIG. 12C: with appropriate choice of the orientation angle δ, the net force along the X-axis can be greater than the net force along the Y-axis.

In the examples shown in FIG. 14A, FIG. 17, and FIG. 18, the platen has a rectangular geometry; and there are four regions, each with rectangular geometries, of the same size.

In general, the shape and size of the platen can be user-specified, the number of regions can be user-specified, and the shape and size of each region can be user-specified.

Figure 20:
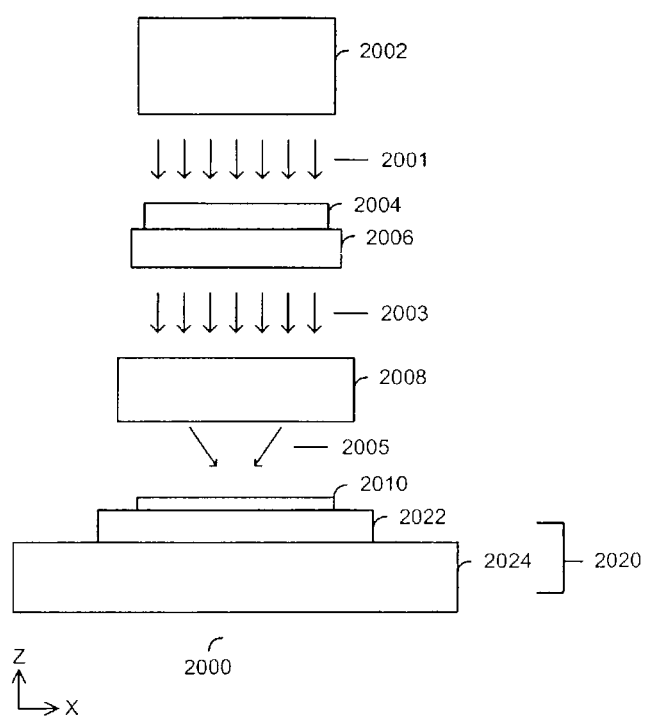
FIG. 20 shows a schematic of a lithographic projection system.

FIG. 20 shows a schematic block diagram of a lithographic projection system 2000. The light source 2002 projects light 2001 through the reticle 2004, which is supported on the reticle holder 2006. The reticle 2004 contains a pattern to be imaged. The light 2003 transmitted through the reticle 2004 is received by the projection system 2008, which focuses the light 2005 onto the surface of a substrate 2010 coated with photoresist. Examples of substrates include semiconductor wafers, liquid-crystal display (LCD) panels, and printed circuit boards (PCBs). The substrate 2010 is held by the stage 2022, which can be moved with respect to the platen 2024. The stage 2022 and the platen 2024 can be components of a planar motor 2020, which can be implemented by embodiments of the invention described above.

Figure 21:
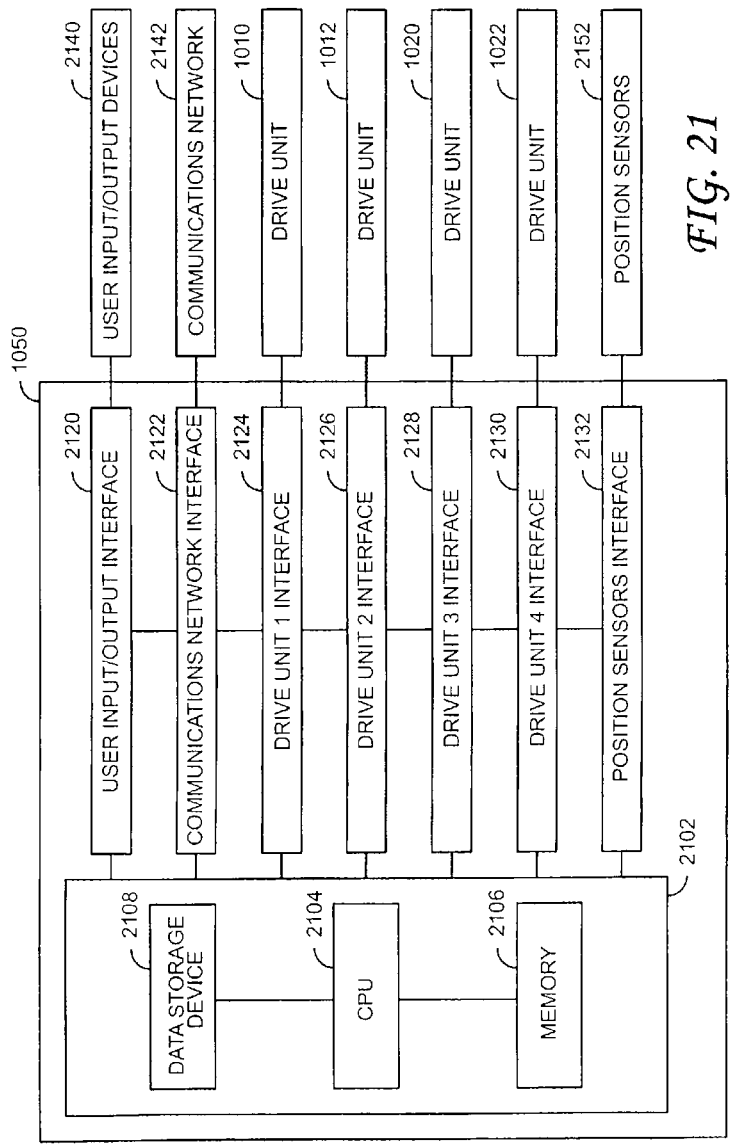
FIG. 21 shows a schematic of a controller implemented with a computational system.

An embodiment of the controller 1050 (FIG. 10) is shown in FIG. 21. One skilled in the art can construct the controller 1050 from various combinations of hardware, firmware, and software. One skilled in the art can construct the controller 1050 from various electronic components, including one or more general purpose processors (such as microprocessors), one or more digital signal processors, one or more application-specific integrated circuits (ASICs), and one or more field-programmable gate arrays (FPGAs).

The controller 1050 includes a computer 2102, which includes a processor [referred to as the central processing unit (CPU)] 2104, memory 2106, and a data storage device 2108. The data storage device 2108 includes at least one persistent, non-transitory, tangible computer readable medium, such as non-volatile semiconductor memory, a magnetic hard drive, or a compact disc read only memory.

The controller 1050 further includes a user input/output interface 2120, which interfaces the computer 2102 to the user input/output devices 2140. Examples of the user input/output devices 2140 include a keyboard, a mouse, a local access terminal, and a video display. Data, including computer executable code, can be transferred to and from the computer 2102 via the user input/output interface 2120.

The controller 1050 further includes a communications network interface 2122, which interfaces the computer 2102 with a communications network 2142. Examples of the communications network 2142 include a local area network and a wide area network. A user can access the computer 2102 via a remote access terminal (not shown) communicating with the communications network 2142. Data, including computer executable code, can be transferred to and from the computer 2102 via the communications network interface 2122.

The controller 1050 further includes the following interfaces:
 a drive unit 1 interface 2124, which interfaces the computer 2102 with the drive unit 1010 (FIG. 10);
 a drive unit 2 interface 2126, which interfaces the computer 2102 with the drive unit 1012 (FIG. 10);
 a drive unit 3 interface 2128, which interfaces the computer 2102 with the drive unit 1020 (FIG. 10);
 a drive unit 4 interface 2130, which interfaces the computer 2102 with the drive unit 1022 (FIG. 10);
 a position sensors interface 2132, which interfaces the computer 2102 with the position sensors 2152.

A planar motor can be operated in an open-loop or a closed-loop configuration. In an open-loop configuration, there is no feedback from position sensors. The position is computed from the direction and distance between steps and the number of steps. In a closed-loop configuration, there is feedback from position sensors, which can be placed on the platen, on the stage, or on both the platen and the stage. An example of position sensors is described in U.S. Pat. No. 5,828,142, previously cited.

As is well known, a computer operates under control of computer software, which defines the overall operation of the computer and applications. The CPU 2104 controls the overall operation of the computer and applications by executing computer program instructions that define the overall operation and applications. The computer program instructions can be stored in the data storage device 2108 and loaded into the memory 2106 when execution of the program instructions is desired. Control algorithms, such as control algorithms for controlling movement of the stage 812 (FIG. 10), can defined by computer program instructions stored in the memory 2106 or in the data storage device 2108 (or in a combination of the memory 2106 and the data storage device 2108) and controlled by the CPU 2104 executing the computer program instructions. For example, the computer program instructions can be implemented as computer executable code programmed by one skilled in the art to perform algorithms. Accordingly, by executing the computer program instructions, the CPU 2104 executes the control algorithms.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A planar motor system comprising:
 a platen comprising:
  a planar surface; and
  a first planar motor component;
 a stage comprising a second planar motor component, wherein the stage, when driven, moves parallel to the planar surface of the platen along a first cardinal axis or along a second cardinal axis; and
 a drive system, wherein the drive system, when energized in a drive configuration, applies to the stage a first force and a second force, wherein:
  the first force has a first force magnitude and a first force direction;
  the first force direction is not parallel to the first cardinal axis;
  the first force direction is not parallel to the second cardinal axis;
  the second force has a second force magnitude and a second force direction;
  the second force direction is not parallel to the first cardinal axis;
  the second force direction is not parallel to the second cardinal axis; and
  a vector sum of the first force and the second force is parallel to the first cardinal axis.

2. The planar motor system of claim 1, wherein the drive configuration is a first drive configuration, and wherein the drive system, when energized in a second drive configuration, applies to the stage a third force and a fourth force, wherein:

the third force has a third force magnitude and a third force direction;

the third force direction is not parallel to the first cardinal axis;

the third force direction is not parallel to the second cardinal axis;

the fourth force has a fourth force magnitude and a fourth force direction;

the fourth force direction is not parallel to the first cardinal axis;

the fourth force direction is not parallel to the second cardinal axis; and a vector sum of the third force and the fourth force is parallel to the second cardinal axis.

3. The planar motor system of claim 2, wherein:

the drive system comprises a controller;

the drive system is energized in the first drive configuration in response to a first command from the controller; and the drive system is energized in the second drive configuration in response to a second command from the controller.

4. The planar motor system of claim 2, wherein a magnitude of the vector sum of the first force and the second force is equal to a magnitude of the vector sum of the third force and the fourth force.

5. The planar motor system of claim 2, wherein a magnitude of the vector sum of the first force and the second force is greater than a magnitude of the vector sum of the third force and the fourth force.

6. The planar motor system of claim 1, wherein the first cardinal axis and the second cardinal axis are orthogonal.

7. The planar motor system of claim 1, wherein:

the platen comprises an array of ferromagnetic teeth aligned along a first array axis and a second array axis, wherein:

the first array axis is not parallel to the first cardinal axis;

the first array axis is not parallel to the second cardinal axis;

the second array axis is not parallel to the first cardinal axis; and the second array axis is not parallel to the second cardinal axis; and the stage comprises a plurality of drive units, wherein each drive unit in the plurality of drive units, when energized, electromagnetically couples to the array of ferromagnetic teeth and applies a force to the stage along the first array axis or along the second array axis.

8. The planar motor system of claim 1, wherein the planar motor system is part of a lithographic projection system, and the stage is configured to carry a substrate.

9. A planar motor system comprising:

a platen having a planar surface, wherein:

the platen comprises a plurality of planar regions; and each specific planar region in the plurality of planar regions comprises a specific array of ferromagnetic ridges aligned along a specific regional array axis;

a stage which, when driven, moves parallel to the planar surface of the platen along a first cardinal axis or along a second cardinal axis, wherein each specific regional array axis is not parallel to the first cardinal axis and is not parallel to the second cardinal axis, and wherein:

the stage comprises a plurality of drive units;

each specific drive unit in the plurality of drive units corresponds to a specific planar region in the plurality of planar regions; and each specific drive unit, when energized, applies a specific force to the stage, wherein the specific force has a specific force magnitude and a specific force direction orthogonal to the specific regional array axis in the corresponding specific planar region; and a controller, wherein, in response to a first command from the controller, at least two specific drive units are energized such that a first force and a second force are applied to the stage, wherein:

the first force has a first force magnitude and a first force direction;

the first force direction is not parallel to the first cardinal axis;

the first force direction is not parallel to the second cardinal axis;

the second force has a second force magnitude and a second force direction;

the second force direction is not parallel to the first cardinal axis;

the second force direction is not parallel to the second cardinal axis; and a vector sum of the first force and the second force is parallel to the first cardinal axis.

10. The planar motor system of claim 9, wherein, in response to a second command from the controller, at least two specific drive units are energized such that a third force and a fourth force are applied to the stage, wherein:

the third force has a third force magnitude and a third force direction;

the third force direction is not parallel to the first cardinal axis;

the third force direction is not parallel to the second cardinal axis;

the fourth force has a fourth force magnitude and a fourth force direction;

the fourth force direction is not parallel to the first cardinal axis;

the fourth force direction is not parallel to the second cardinal axis; and a vector sum of the third force and the fourth force is parallel to the second cardinal axis.

11. The planar motor system of claim 10, wherein a magnitude of the vector sum of the first force and the second force is equal to a magnitude of the vector sum of the third force and the fourth force.

12. The planar motor system of claim 10, wherein a magnitude of the vector sum of the first force and the second force is greater than a magnitude of the vector sum of the third force and the fourth force.

* * * * *